(12) United States Patent
Fukuchi et al.

(10) Patent No.: US 9,864,829 B2
(45) Date of Patent: Jan. 9, 2018

(54) MULTILAYER SUBSTRATE, DESIGN METHOD OF MULTILAYER SUBSTRATE, MANUFACTURING METHOD OF SEMICONDUCTOR DEVICE, AND RECORDING MEDIUM

(71) Applicant: Toshbia Memory Corporation, Minato-ku (JP)

(72) Inventors: Satoru Fukuchi, Chigasaki (JP); Yoshihiro Iida, Minato (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 89 days.

(21) Appl. No.: 14/847,479

(22) Filed: Sep. 8, 2015

(65) Prior Publication Data

US 2016/0307853 A1    Oct. 20, 2016

Related U.S. Application Data

(60) Provisional application No. 62/149,982, filed on Apr. 20, 2015.

(51) Int. Cl.
*G06F 17/50* (2006.01)
*H01L 23/498* (2006.01)

(52) U.S. Cl.
CPC ...... *G06F 17/5081* (2013.01); *G06F 17/5068* (2013.01); *G06F 17/5072* (2013.01); *G06F 17/5077* (2013.01); *H01L 23/49822* (2013.01); *H01L 23/49838* (2013.01)

(58) Field of Classification Search
CPC ............. G06F 17/5081; G06F 17/5072; G06F 17/5068; G06F 17/5077; H01L 23/49838; H01L 23/49822
See application file for complete search history.

(56) References Cited

U.S. PATENT DOCUMENTS 5,479,138 A * 12/1995 Kuroda ................... H01P 3/088
                                                            333/1
6,303,871 B1 * 10/2001 Zu ...................... H01L 23/49838
                                                            174/250

(Continued)

FOREIGN PATENT DOCUMENTS

JP          7-321463         12/1995
JP          2006-86293       3/2006

(Continued)

*Primary Examiner* — Nha Nguyen
(74) *Attorney, Agent, or Firm* — Oblon, McClelland, Maier & Neustadt, L.L.P.

(57) ABSTRACT

According to one embodiment, there is provided a multilayer substrate including a ground layer and a signal layer. The ground layer includes a mesh ground having multiple openings. The signal layer is laid above the ground layer and including multiple signal lines. The multiple openings include first openings and second openings. The first openings overlap a first signal line from among the multiple signal lines when seen through in a direction perpendicular to a surface of the multilayer substrate. The second openings overlap the first signal line when seen through in the direction perpendicular to the surface of the multilayer substrate. The first openings have a first form, and the second openings have a second form different from the first form.

10 Claims, 13 Drawing Sheets

(56) References Cited

U.S. PATENT DOCUMENTS

| | | | | |
|---|---|---|---|---|
| 6,496,081 B1 * | 12/2002 | Govind | ............... | H01P 3/003 |
| | | | | 174/261 |
| 7,839,135 B2 | 11/2010 | Kobayashi et al. | | |
| 7,975,251 B2 | 7/2011 | Fujimori | | |
| 2009/0056999 A1 * | 3/2009 | Kashiwakura | ....... | H05K 1/0251 |
| | | | | 174/262 |

FOREIGN PATENT DOCUMENTS

| | | |
|---|---|---|
| JP | 4780318 | 9/2011 |
| JP | 4796524 | 10/2011 |
| JP | 5332880 | 11/2013 |

* cited by examiner

MULTILAYER SUBSTRATE, DESIGN METHOD OF MULTILAYER SUBSTRATE, MANUFACTURING METHOD OF SEMICONDUCTOR DEVICE, AND RECORDING MEDIUM

CROSS-REFERENCE TO RELATED APPLICATIONS

This application is based upon and claims the benefit of priority from U.S. Provisional Application No. 62/149,982, filed on Apr. 20, 2015; the entire contents of which are incorporated herein by reference.

FIELD

Embodiments described herein relate generally to a multilayer substrate, a design method of the multilayer substrate, a manufacturing method of a semiconductor device, and a recording medium.

BACKGROUND

In multilayer substrates, a signal layer including signal lines may be laid above a ground layer. In this case, it is desired to suppress degradation in electrical characteristics of the signal lines.

DETAILED DESCRIPTION

In general, according to one embodiment, there is provided a multilayer substrate including a ground layer and a signal layer. The ground layer includes a mesh ground having multiple openings. The signal layer is laid above the ground layer and including multiple signal lines. The multiple openings include first openings and second openings. The first openings overlap a first signal line from among the multiple signal lines when seen through in a direction perpendicular to a surface of the multilayer substrate. The second openings overlap the first signal line when seen through in the direction perpendicular to the surface of the multilayer substrate. The first openings have a first form, and the second openings have a second form different from the first form.

Exemplary embodiments of a multilayer substrate will be explained below in detail with reference to the accompanying drawings. The present invention is not limited to the following embodiments.

First Embodiment

Figure 1:
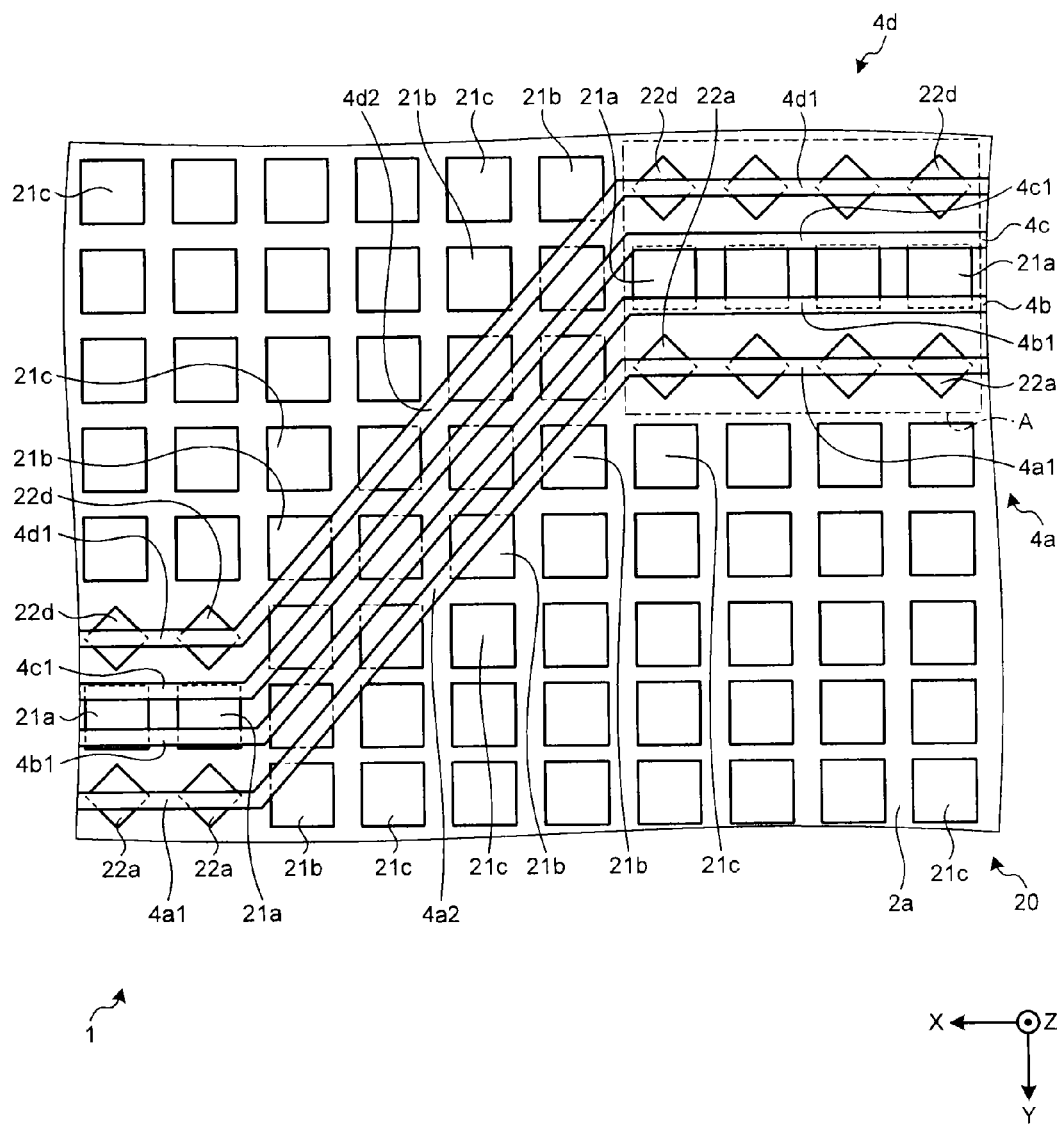
FIG. 1 is a plan view showing the configuration of a multilayer substrate according to a first embodiment.
Figure 2A:
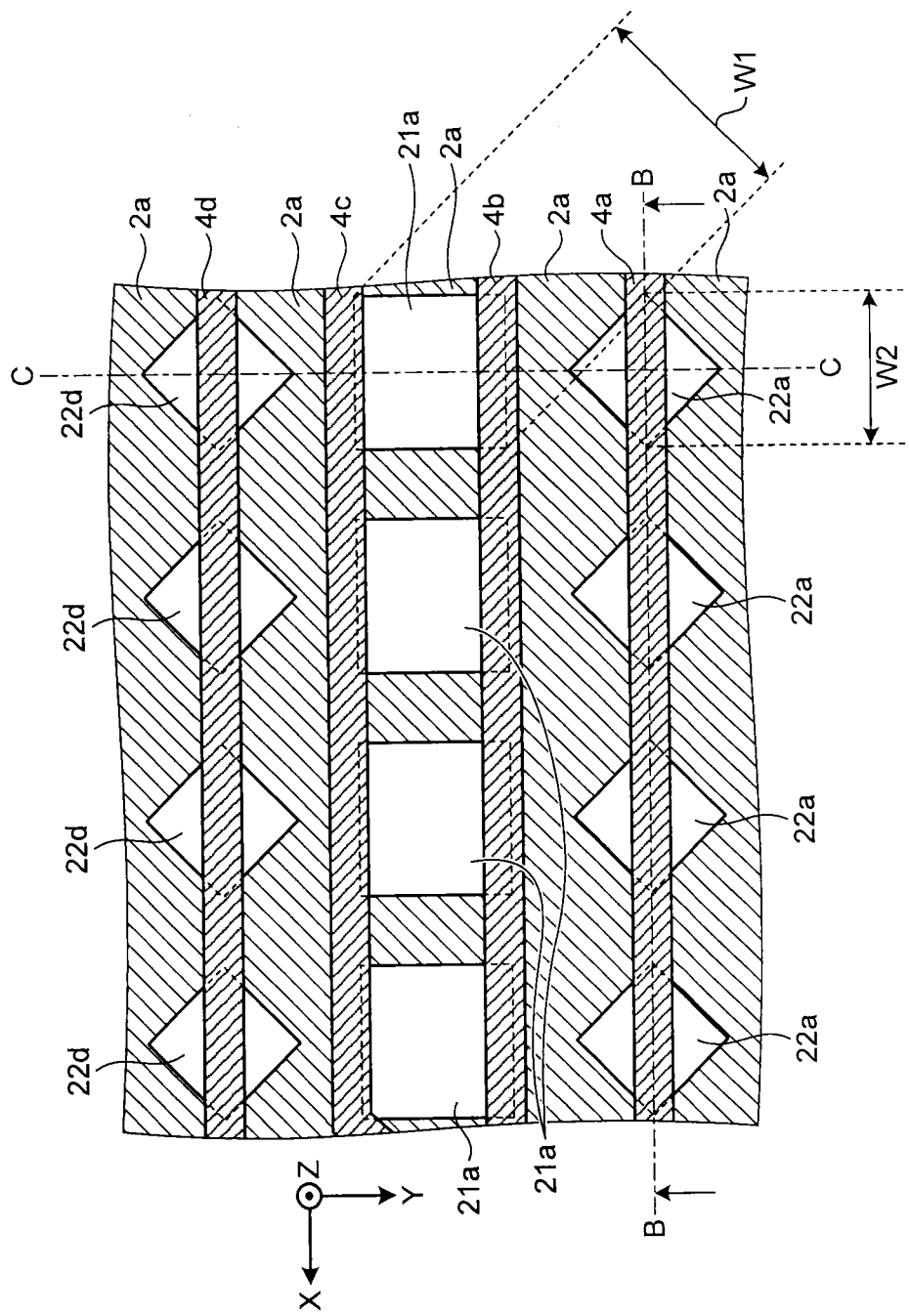
FIG. 2A is an enlarged plan view of part A of FIG. 1 in the first embodiment.
Figure 2B:
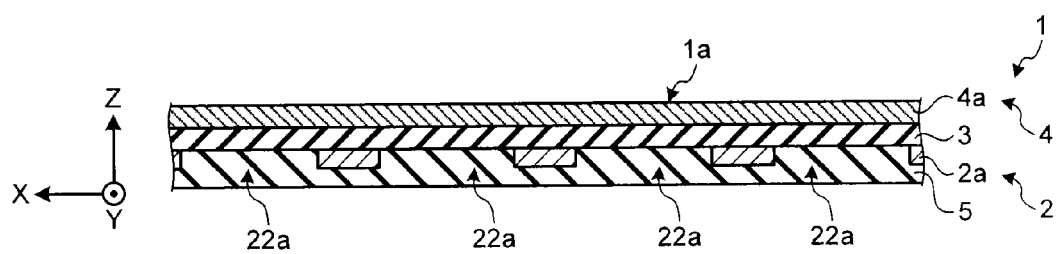
FIG. 2B is a cross-sectional view taken along line B-B of FIG. 2A in the first embodiment.
Figure 2C:
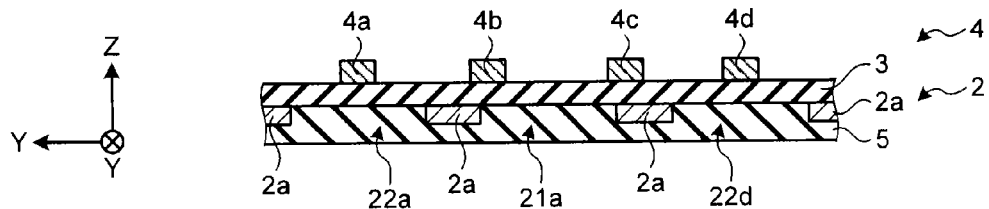
FIG. 2C is a cross-sectional view taken along line C-C of FIG. 2A in the first embodiment.

A multilayer substrate 1 according to the first embodiment will be described using FIGS. 1 to 2C. FIG. 1 is a plan view showing the configuration of the multilayer substrate 1 and illustrates part of the plan configuration of the multilayer substrate 1 seen from its surface 1a side. FIG. 2A is an enlarged plan view of part A of FIG. 1. FIG. 2B is a cross-sectional view taken along line B-B of FIG. 2A. FIG. 2C is a cross-sectional view taken along line C-C of FIG. 2A.

The multilayer substrate 1 has, for example, semiconductor chips (not shown) mounted thereon and can be formed as a semiconductor device (semiconductor package). The multilayer substrate 1 can function as a package substrate.

In the multilayer substrate 1, as shown in FIGS. 2B, 2C, a signal layer 4 including multiple signal lines 4a to 4d may be laid above a ground layer 2. In the multilayer substrate 1, for example, an insulating layer 5, the ground layer 2, an insulating layer 3, and the signal layer 4 may be laid one over another in that order. Although the multilayer substrate 1 can have more layers laid one over another, some layers laid one over another in the multilayer substrate 1 are shown in FIGS. 2B, 2C for simplicity of illustration.

A mesh ground 2a is placed in the ground layer 2. That is, if moisture stays in the multilayer substrate 1, then the peeling of the films of the signal lines 4a to 4d may occur. Accordingly, moisture in the multilayer substrate 1 needs to be released to the outside, and the mesh ground 2a having multiple openings 20 is provided to secure release paths. The mesh ground 2a having rectangular openings 20 regularly arranged is provided in the ground layer 2. By setting an average one among the respective largest widths of the openings 20 to be greater than or equal to a required size, the long-term reliability of the semiconductor device (semiconductor package) can be improved to be greater than or equal to a required level.

Each of the signal lines 4a to 4d is connected on one end side to a signal terminal of a semiconductor chip (not shown) and connected on the other end side to a terminal of a connector (not shown) that can connect to an external controller. That is, because of functioning as a bus line, the signal lines 4a to 4d are required to have substantially the same electrical characteristics (e.g., a high frequency characteristic). In this situation, it is desirable to shorten the path of a return current for a signal current flowing through each signal line 4a to 4d. Thus, it is desirable to place the signal lines 4a to 4d in such a way that the signal lines 4a to 4d do not overlap openings 20 of the mesh ground 2a when seen through in a direction perpendicular to the surface 1a of the multilayer substrate 1.

However, as integrated circuits formed in semiconductor chips mounted on the multilayer substrate 1 become finer, the degrees of freedom in placement of the signal lines 4a to 4d and the degrees of freedom in placement of the mesh ground 2a in the multilayer substrate 1 both become more likely to be restricted. Hence, it tends to be difficult to lay them out in such a way that the signal lines 4a to 4d do not overlap openings 20 of the mesh ground 2a when seen through in a direction perpendicular to the surface 1a of the multilayer substrate 1.

If the signal lines 4a to 4d overlap openings 20 of the mesh ground 2a when seen through in a direction perpendicular to the surface 1a of the multilayer substrate 1, then the path length of a return current flowing through the mesh ground 2a is likely to be longer as compared with the path length of a signal current flowing through the signal line 4a to 4d. If the path length of the return current becomes longer as compared with the path length of the signal current, then the electrical characteristics (e.g., a high frequency characteristic) of the signal current flowing through the signal line 4a to 4d is likely to degrade. In this situation, the overlap area between each signal line 4a to 4d and openings 20 of the mesh ground 2a, when seen through in a direction perpendicular to the surface 1a of the multilayer substrate 1, is likely to vary, so that the electrical characteristics (e.g., a high frequency characteristic) may vary between the signal lines 4a to 4d.

If variation in the electrical characteristics between the signal lines 4a to 4d increases, the signal line of the signal lines 4a to 4d which has degraded the most in characteristics determines the performance of the multilayer substrate 1, so that the performance of the multilayer substrate 1 may be considerably restricted.

Accordingly, in the present embodiment, by implementing tactics in the form of openings overlapping signal lines of the signal lines 4a to 4d which are likely to degrade from among multiple openings 20 in the mesh ground 2a, variation in the electrical characteristics between the signal lines 4a to 4d can be suppressed.

To be specific, as shown in FIG. 1, where multiple openings 20 are arranged in a matrix in plan view, let X and Y directions be arrangement directions of the openings 20 and a Z direction be a direction perpendicular to the surface 1a (see FIG. 2B) of the multilayer substrate 1. The X and Y directions are substantially perpendicular to each other in a plane substantially perpendicular to the Z direction. The multiple signal lines 4a to 4d are placed substantially parallel to each other in plan view. Suppose that it has been ascertained experimentally beforehand the electrical characteristics of which signal lines of the signal lines 4a to 4d are likely to degrade if the forms of the openings 20 are the same.

If the electrical characteristics of the signal lines 4a, 4d from among the signal lines 4a to 4d are likely to degrade, then the form of second openings 22a, 22d from among the multiple openings 20 is made different from the form of first openings 21a, 21b, 21c correspondingly to the layout of the signal lines 4a, 4d.

That is, from among the multiple openings 20, openings overlapping parts 4a1, 4d1 of the signal lines 4a, 4d extending substantially parallel to either the X direction or the Y direction when seen through in a Z direction are referred to as second openings 22a, 22d, and the other openings are referred to as first openings 21a, 21b, 21c.

Of the first openings 21a, 21b, 21c, the first openings 21a overlap parts 4a1, 4d1 of the signal lines 4a, 4d extending substantially parallel to the X direction when seen through in a Z direction. The first openings 21b overlap parts 4a2 to 4d2 of the signal lines 4a to 4d extending across both the X and Y directions when seen through in a Z direction. The first openings 21c do not overlap the signal lines 4a to 4d when seen through in a Z direction.

The form (first form) of the first openings 21a, 21b, 21c includes a substantially rectangular shape of outline, a first orientation with which a diagonal line of the first opening crosses both the X and Y directions, and a first largest width W1 (see FIG. 2A).

In contrast, the form (second form) of the second openings 22a, 22d includes a substantially rectangular shape of outline, a second orientation with which a diagonal line of the second opening is substantially parallel to either the X direction or the Y direction, and a second largest width W2 (see FIG. 2A). The second orientation is an orientation obtained by rotating the first orientation through about 45° around the Z axis. The second largest width W2 is smaller than the first largest width W1 so that the placement positions of the second openings 22a, 22d are level with the placement positions of the first openings 21a, 21b, 21c. For example, the second largest width W2 is smaller than the first largest width W1 so that the X positions of the centers of the second openings 22a, 22d are substantially the same as the X positions of the centers of the first openings 21a, 21b, 21c. The center of the first opening 21a, 21b, 21c substantially coincides with the intersection of two diagonal lines of the first opening 21a, 21b, 21c. The center of the second openings 22a, 22d substantially coincides with the intersection of two diagonal lines of the second openings 22a, 22d. Or, for example, the second largest width W2 is smaller than the first largest width W1 so that the width along the X direction of the second openings 22a, 22d is substantially the same as the width along the X direction of the first openings 21a, 21b, 21c.

Figure 3:
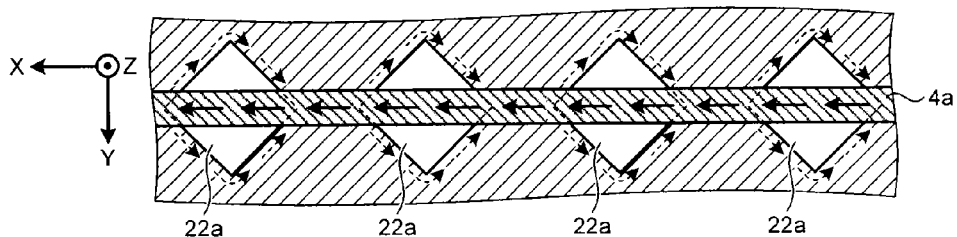
FIG. 3 is a diagram showing the paths of a signal current and return currents in the first embodiment.

With the second form, the path from a point on the outline on the +X side of the center of the opening along the outline to a point on the outline on the −X side thereof is shorter in length than with the first form. That is, by providing the second openings 22a, 22d in the second form, the path lengths of return currents (indicated by broken-line arrows in FIG. 3) corresponding to the path lengths of signal currents (indicated by solid arrows in FIG. 3) flowing through the parts 4a1, 4d1 of the signal lines 4a, 4d extending substantially parallel to either the X direction or the Y direction can be shortened as compared with the case of providing the second openings 22a, 22d in the first form. FIG. 3 is a diagram showing the paths of a signal current and return currents and is a plan view showing an area including the multiple second openings 22a in FIG. 2A. Thus, the electrical characteristics of the signal lines 4a, 4d, which are likely to degrade in electrical characteristics, from among the multiple signal lines 4a to 4d can be selectively improved, so that variation in the electrical characteristics between the signal lines 4a to 4d can be suppressed.

It should be noted that the first largest width W1 and the second largest width W2 (see FIG. 2A) are both decided on such that an average one among the largest widths of the openings 20 is greater than or equal to a required size. Therefore, the long-term reliability of the semiconductor device (semiconductor package) can be improved to be greater than or equal to a required level, and variation in the electrical characteristics between the signal lines 4a to 4d can be suppressed.

Note that the second form is not limited to the one illustrated in FIG. 1 as long as the path from a point on the outline on the +X side of the center of the opening along the outline to a point on the outline on the −X side thereof is shorter in length than with the first form.

Figure 4:
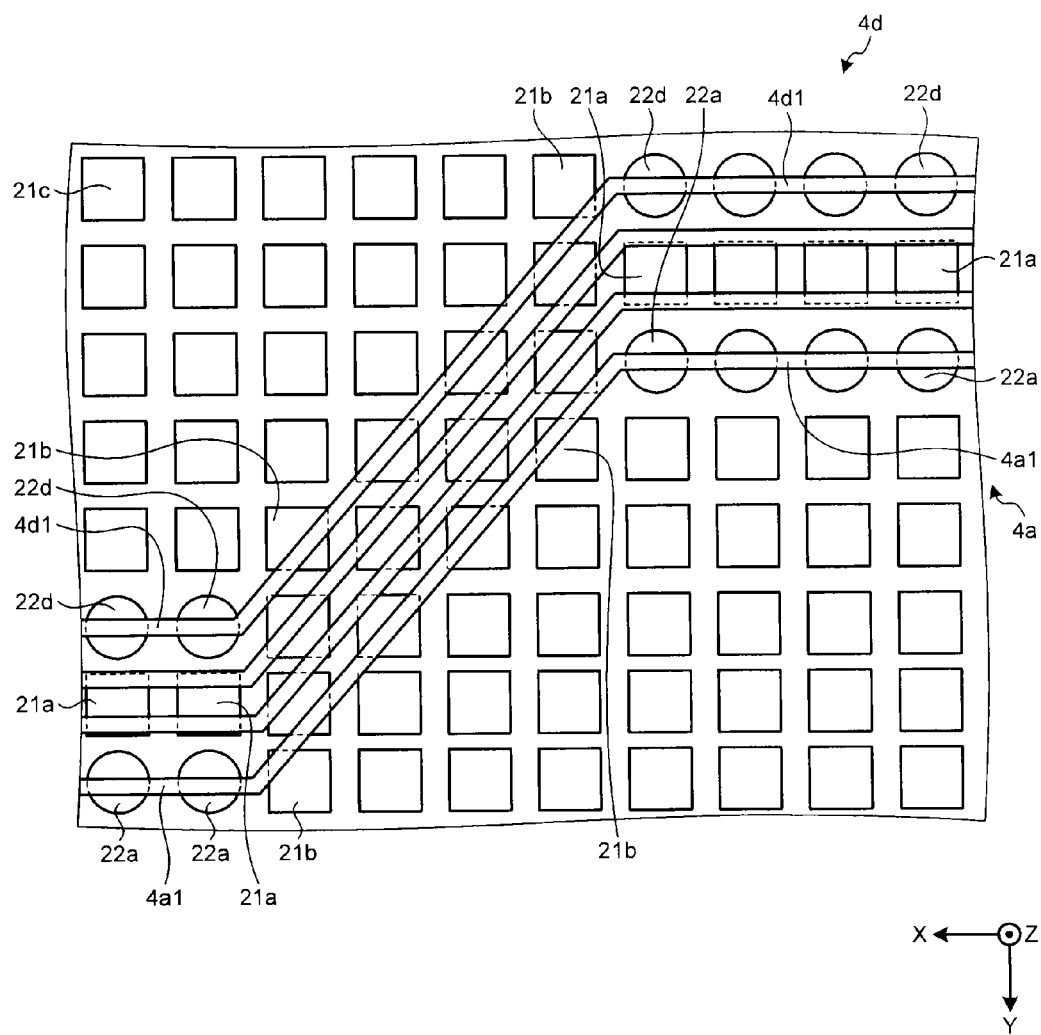
FIG. 4 is a plan view showing the configuration of a multilayer substrate according to a modified example of the first embodiment.

For example, as shown in FIG. 4, the outline of the opening may be different in shape between the second form and the first form. That is, the form (second form) of the second openings 22a, 22d includes a substantially circular shape of outline. A shape of outline in a polygon shape having, e.g., 16 or more corners can be regarded as a substantially circular shape of outline. In contrast, the form (first form) of the first openings 21a, 21b, 21c includes a substantially rectangular shape of outline. In this case, the second largest width (the diameter of the substantially circular shape) included in the second form is smaller than the first largest width (the length of a longer one of two diagonal lines) included in the first form so that the placement positions of the second openings 22a, 22d are level with the placement positions of the first openings 21a, 21b, 21c. For example, the second largest width (the diameter of the substantially circular shape) is smaller than the first largest width (the length of a diagonal line) so that the X positions of the centers of the second openings 22a, 22d are substantially the same as the X positions of the centers of the first openings 21a, 21b, 21c. The center of the first opening 21a, 21b, 21c substantially coincides with the intersection of two diagonal lines of the first opening 21a, 21b, 21c. The center of the second opening 22a, 22d substantially coincides with the center of the substantially circular shape. Or, for example, the second largest width (the diameter of the substantially circular shape) is smaller than the first largest width (the length of a diagonal line) so that the width along the X direction of the second openings 22a, 22d are substantially the same as the width along the X direction of the first openings 21a, 21b, 21c.

Figure 5:
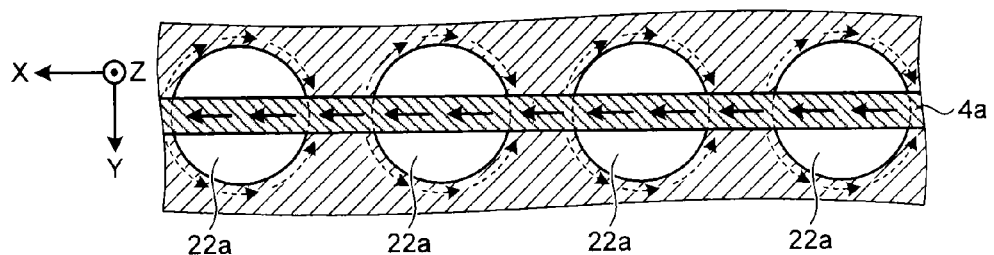
FIG. 5 is a diagram showing the paths of a signal current and return currents in a modified example of the first embodiment.

In this case, with the second form, the path from a point on the outline on the +X side of the center of the opening along the outline to a point on the outline on the −X side thereof is shorter in length than with the first form. FIG. 5 is a diagram showing the paths of a signal current and return currents and is a plan view showing an area including the multiple second openings 22a in FIG. 4. By providing the second openings 22a, 22d in the second form, the path lengths of return currents (indicated by broken-line arrows in FIG. 5) corresponding to the path lengths of signal currents (indicated by solid arrows in FIG. 5) flowing through the parts 4a1, 4d1 of the signal lines 4a, 4d extending substantially parallel to either the X direction or the Y direction can be shortened as compared with the case of providing the second openings 22a, 22d in the first form.

Second Embodiment

Next, a multilayer substrate 200 according to the second embodiment will be described. Description will be made below focusing on the differences from the first embodiment.

In the first embodiment, with placement positions in a matrix as the base, by selectively making the form of some of the multiple openings different from that of the other openings, the suppression of variation in electrical characteristics between the multiple signal lines 4a to 4d is aimed at.

The second embodiment adopts placement positions in a staggered pattern instead of placement positions in a matrix, and by making the shape of outline of each of multiple openings substantially circular, the suppression of variation in electrical characteristics between the multiple signal lines 4a to 4d without selectively making the form of some openings different is aimed at.

Figure 6:
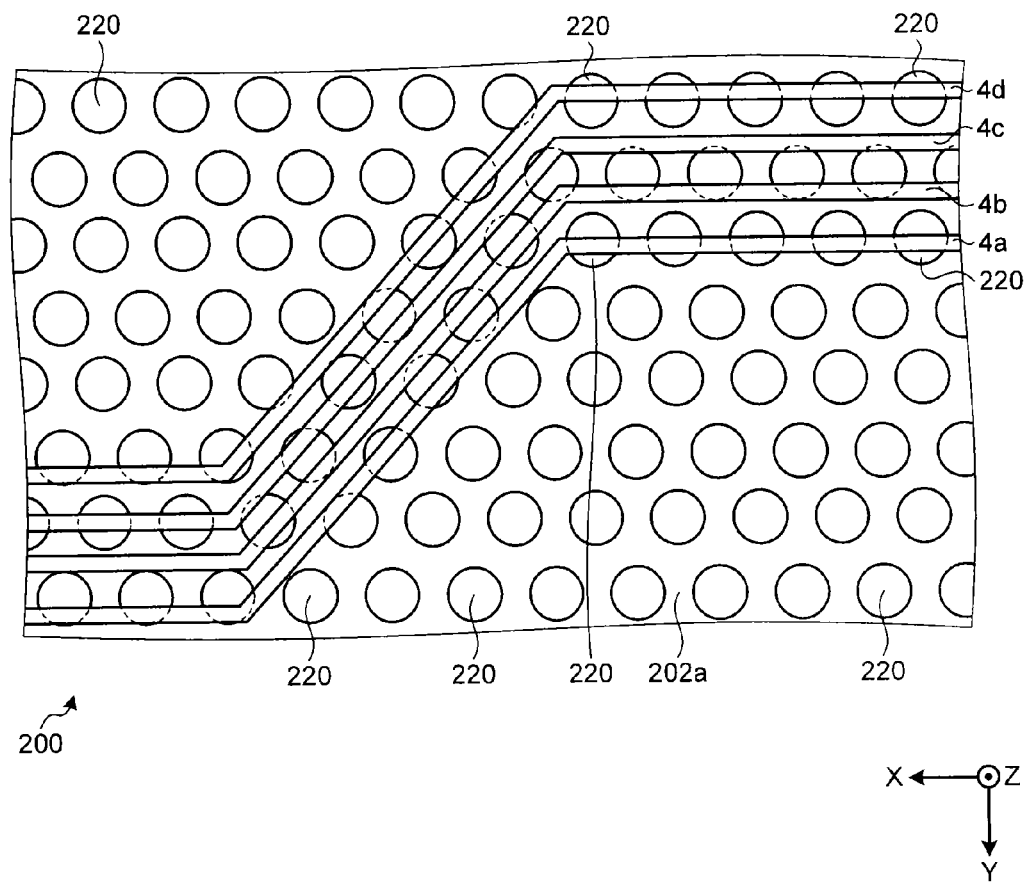
FIG. 6 is a plan view showing the configuration of a multilayer substrate according to a second embodiment.

Specifically, as shown in FIG. 6, multiple openings 220 are arranged in a staggered pattern in plan view. FIG. 6 is a plan view showing the configuration of the multilayer substrate 200 and illustrates part of the plan configuration seen from the front side of the multilayer substrate 200. For example, by displacing placement positions of openings in every other row in the configuration of FIG. 1 by about half of the X-direction placement pitch and changing the shape of outline of each opening to a substantially circular shape with making the largest widths of the openings even, the configuration of FIG. 6 can be obtained. In the configuration shown in FIG. 6, with placement positions in a staggered pattern as the base, the shape of outline of each of the multiple openings 220 is substantially circular.

With the configuration shown in FIG. 6, variation between respective overlap areas between the multiple signal lines 4a to 4d and conductor parts of a mesh ground 202a when seen through in a Z direction can be easily suppressed. Thus, variation in electrical characteristics between the multiple signal lines 4a to 4d can be suppressed.

In this situation, by setting an average one among the largest widths of the openings 220 to be greater than or equal to a required size, the long-term reliability of the semiconductor device (semiconductor package) can be improved to be greater than or equal to a required level. Thus, while the long-term reliability of the semiconductor device (semiconductor package) can be improved to be greater than or equal to a required level, variation in electrical characteristics between the signal lines 4a to 4d can be suppressed.

Third Embodiment

Next, a method of designing a multilayer substrate according to the third embodiment will be described. Description will be made below focusing on the differences from the first embodiment.

In the first embodiment, without changing the relative placement of the signal lines 4a to 4d and the mesh ground 2a in the multilayer substrate 1, the suppression of variation in electrical characteristics between the multiple signal lines 4a to 4d is aimed at.

However, even if the degrees of freedom in placement of the signal lines and the degrees of freedom in placement of the mesh ground in the multilayer substrate 1 are both likely to be restricted, there may be room for a change in the relative placement of the signal lines and the mesh ground.

Accordingly, in the third embodiment, by changing the relative placement of the signal lines and the mesh ground in the multilayer substrate, the suppression of variation in electrical characteristics between the multiple signal lines is aimed at. Such a method of designing a multilayer substrate can be made more efficient by executing by interactive processing and/or batch processing with use of a CAD (Computer Aided Design) tool.

Figure 7:
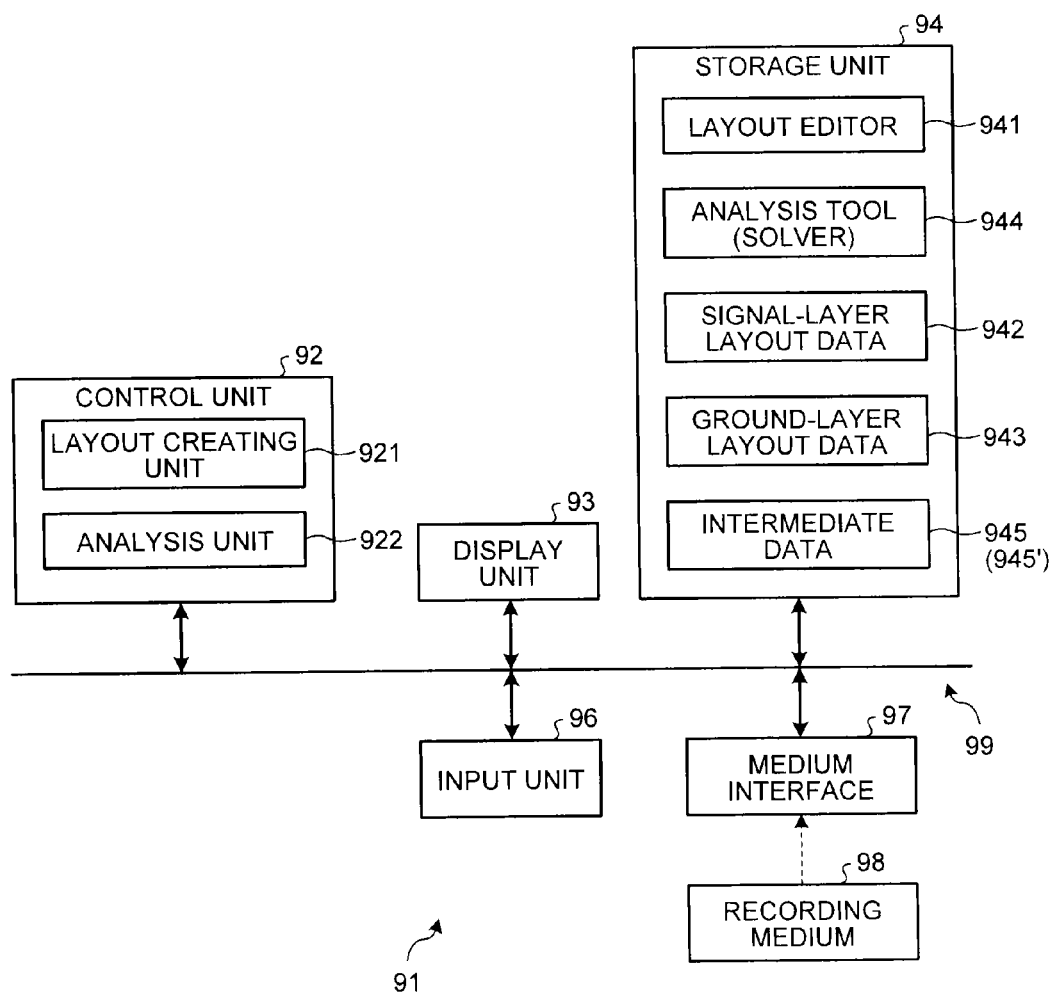
FIG. 7 is a diagram showing the configuration of a computer which can execute a method of designing a multilayer substrate according to a third embodiment.

Specifically, the method of designing a multilayer substrate according to the present embodiment is executable on a computer as shown in FIG. 7. FIG. 7 is a diagram showing the configuration of a computer which can execute the method of designing a multilayer substrate according to the embodiment.

The computer 91 comprises a bus line 99, a control unit 92, a display unit 93, a storage unit 94, an input unit 96, and a medium interface 97.

The control unit 92, display unit 93, storage unit 94, input unit 96, and medium interface 97 are connected to each other via the bus line 99. The medium interface 97 is configured such that a recording medium 98 is connectable thereto.

The storage unit 94 stores a layout editor 941, an analysis tool 944, signal-layer layout data 942, and ground-layer layout data 943.

The layout editor 941 is a CAD tool for performing layout design in the design of a multilayer substrate. The signal-layer layout data 942 is layout data created for a signal layer 304 (see FIG. 14B). The ground-layer layout data 943 is layout data created for a ground layer 302 (see FIG. 14B).

The analysis tool 944 is a solver which performs a predetermined calculation to change layout data according to the calculation result in the design of a multilayer substrate. The solver is software which calculates the solution when a mathematical model for optimization is entered in text format or the like. In the present embodiment, layout data is changed to satisfy predetermined restriction conditions using the solver.

The control unit 92 is, for example, a CPU, GPU, DSP, or microcomputer and further includes a cache memory for temporary storage. Further, the control unit 92 includes a layout creating unit 921 and an analysis unit 922.

The layout creating unit 921 is functionally realized in the control unit 92 by the layout editor 941 being executed. For example, the layout creating unit 921 creates the signal-layer layout data 942 and the ground-layer layout data 943.

The analysis unit 922 is functionally realized in the control unit 92 by the analysis tool 944 being executed. The control unit 922 receives a physical design standard (design rules), predetermined restriction conditions, the signal-layer layout data 942, and the ground-layer layout data 943. The analysis unit 922 determines the layout of openings 320-1 to 320-12 to satisfy the predetermined restriction conditions within the scope of the design rules being satisfied. The predetermined restriction conditions include the condition that variation between respective overlap areas (coupling areas) between the signal lines 304a to 304f and conductor parts of a mesh ground 302a when seen through in a Z direction (see FIG. 14A) be within an acceptable range.

The display unit 93 is a display device such as a CRT display, a liquid crystal display, or the like. The storage unit 94 is, for example, a memory, a hard disk, or the like. The input unit 96 is, for example, a key board, a mouse, or the like. The medium interface 97 is, for example, a flexible disk drive, a CD-ROM drive, a USB interface, or the like. The recording medium 98 is a flexible disk, a CD-ROM, a USB memory, or the like. For example, the layout editor 941 and the analysis tool 944 can both be installed into the storage unit 94 from the recording medium 98 via the medium interface 97.

Figure 8:
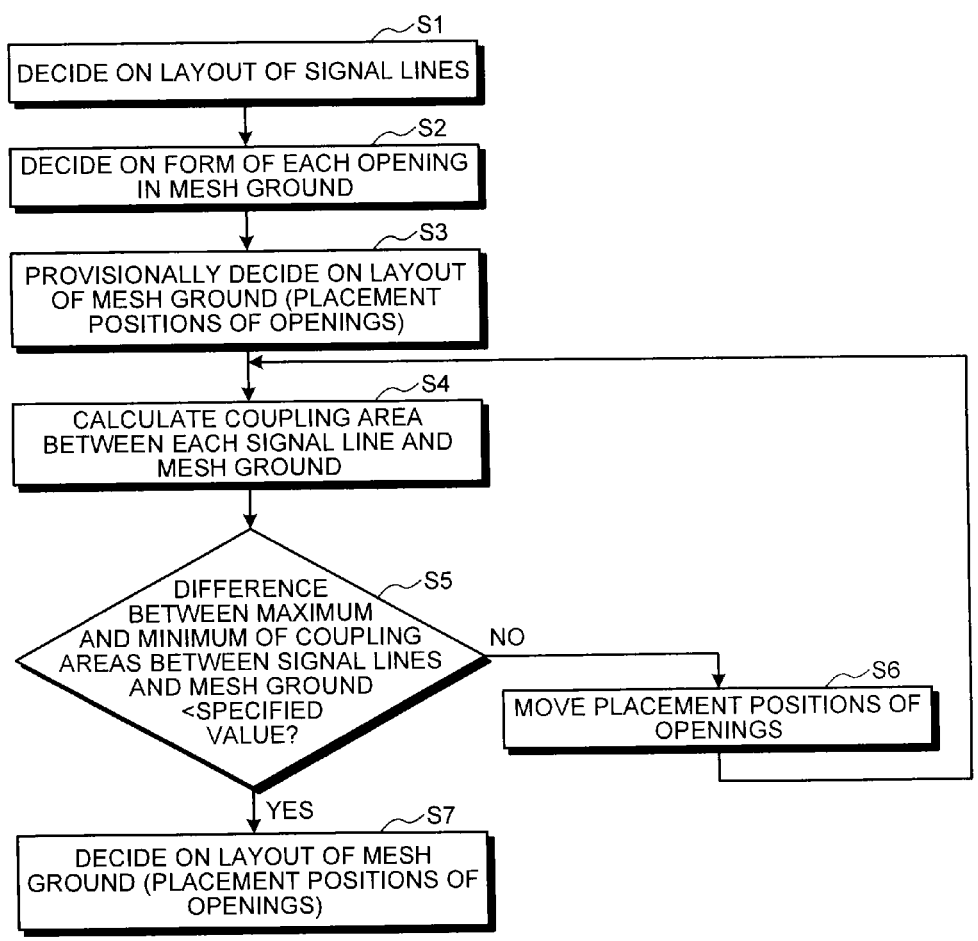
FIG. 8 is a flow chart showing the method of designing a multilayer substrate according to the third embodiment.
Figure 9:
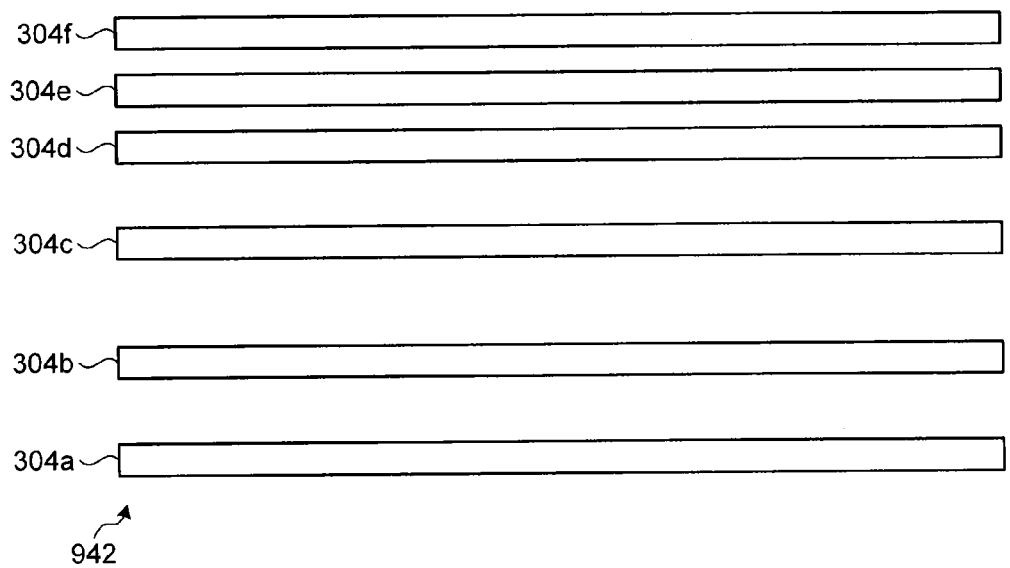
FIG. 9 is a diagram showing layout data of signal lines in the third embodiment.
Figure 10:
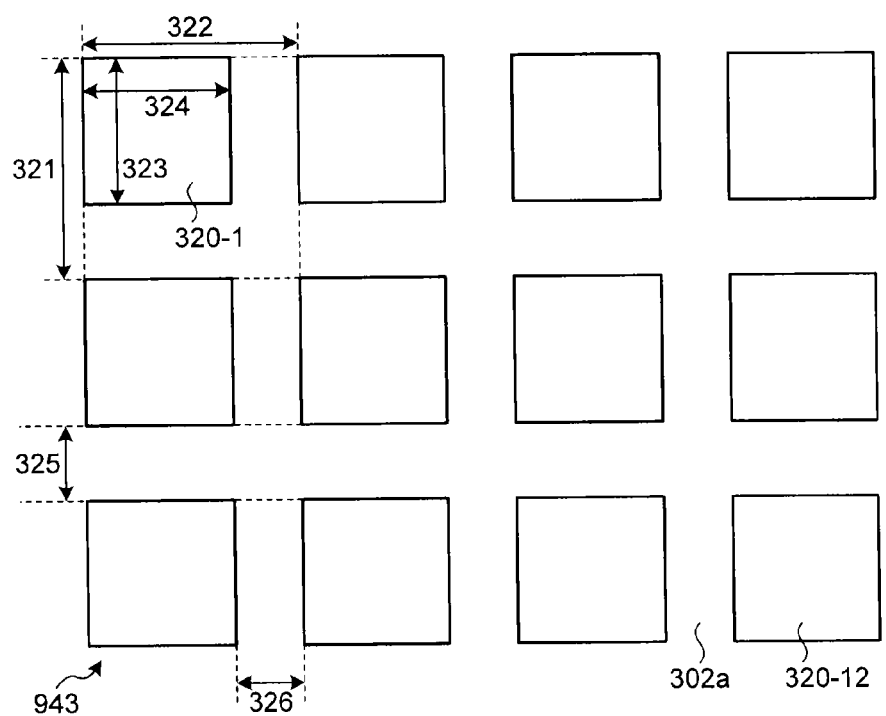
FIG. 10 is a diagram showing layout data of a mesh ground in the third embodiment.
Figure 11:
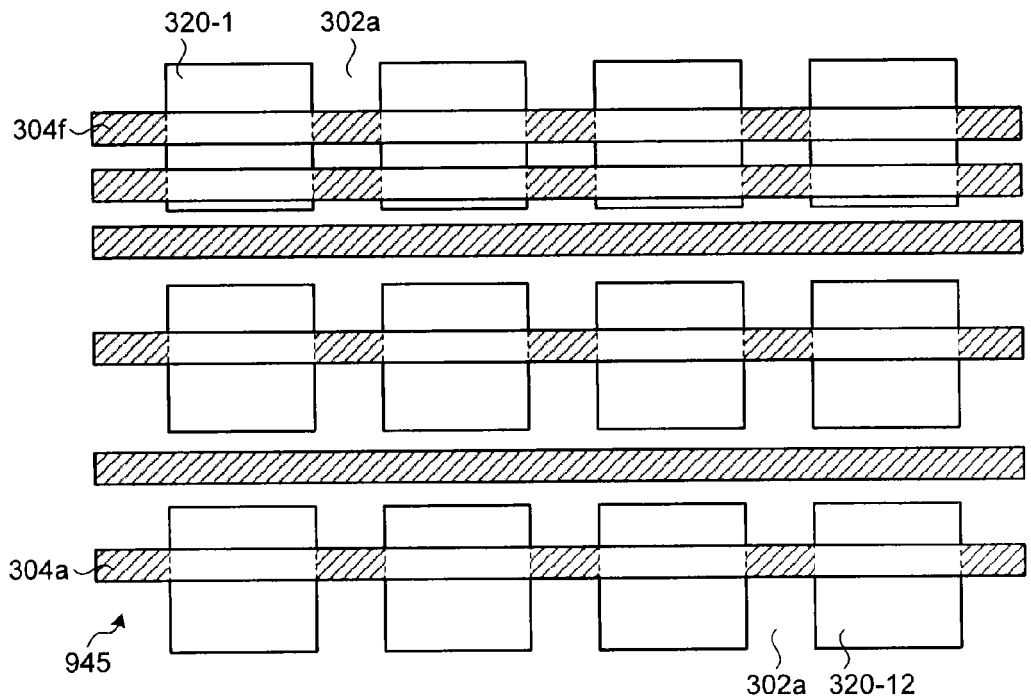
FIG. 11 is a diagram showing overlap areas between the signal lines and the mesh ground in the third embodiment.
Figure 12:
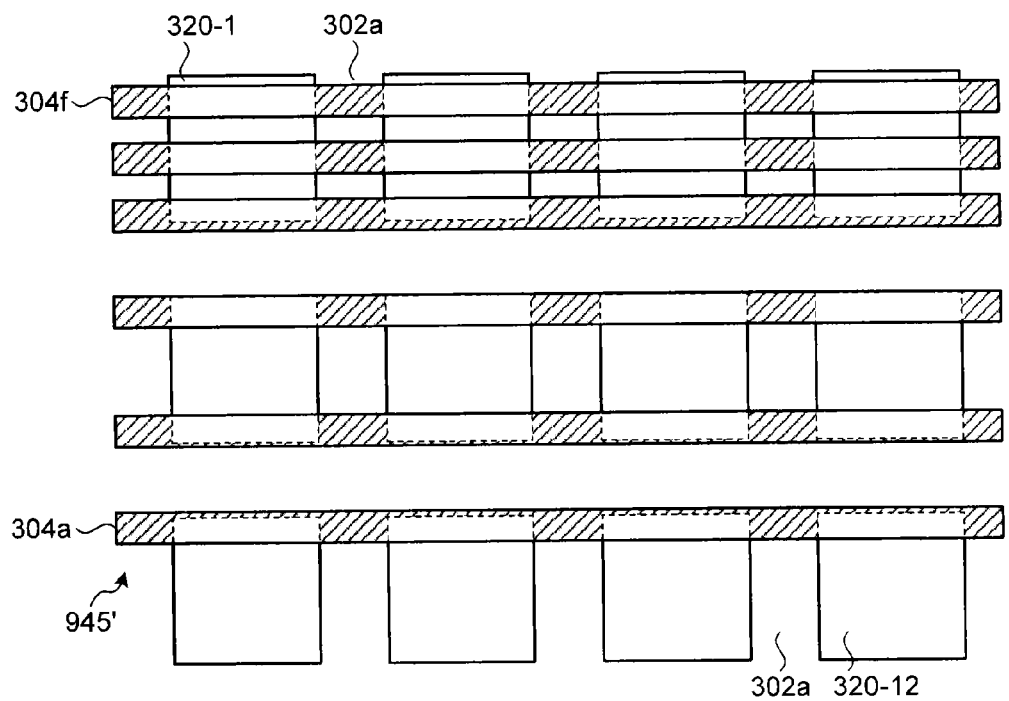
FIG. 12 is a diagram showing overlap areas between the signal lines and the mesh ground after the mesh ground is moved in the third embodiment.

Next, the method of designing a multilayer substrate will be described using FIGS. 8 to 12. FIG. 8 is a flow chart showing the method of designing a multilayer substrate. FIG. 9 is a diagram showing layout data of signal lines. FIG. 10 is a diagram showing layout data of a mesh ground. FIG. 11 is a diagram showing overlap areas between the signal lines and the mesh ground. FIG. 12 is a diagram showing overlap areas between the signal lines and the mesh ground after the mesh ground is moved.

The layout creating unit 921 decides on the layout of the multiple signal lines 304a to 304f (S1). For example, the layout creating unit 921 places objects of the signal lines 304a to 304f on a layout chart as shown in FIG. 9 to create the signal-layer layout data 942.

The layout creating unit 921 decides on the form of each opening in the mesh ground 302a (S2). For example, as shown in FIG. 10, the layout creating unit 921 decides on the longitudinal size 321 and transverse size 322 of a unit region and the longitudinal size 323 and transverse size 324 of the opening according to instructions from a user via the input unit 96. Or, for example, the layout creating unit 921 decides on the longitudinal size 321 and transverse size 322 of a unit region and the ratio of the area of the opening to the unit region (the opening ratio) according to instructions from a user via the input unit 96. Or, for example, the layout creating unit 921 decides on the longitudinal size 323 and transverse size 324 of the opening and the distances 325, 326 between adjacent openings according to instructions from a user via the input unit 96.

The layout creating unit 921 provisionally decides on the layout of the mesh ground 302a (the placement positions of the openings) according to the decision at S2 (S3). For example, as shown in FIG. 10, the layout creating unit 921 places objects of the openings 320-1 to 320-12 in a matrix on a layout chart according to the decision at S2 to create the ground-layer layout data 943.

The analysis unit 922 receives the signal-layer layout data 942 and the ground-layer layout data 943 from the layout creating unit 921. The analysis unit 922 places objects of the signal lines 304a to 304f and objects of the openings 320-1 to 320-12 to overlap on a layout chart based on the signal-layer layout data 942 and the ground-layer layout data 943 so as to create intermediate data 945 as shown in FIG. 11. The analysis unit 922 calculates overlap areas (coupling areas) between the signal lines 304a to 304f and conductor parts of the mesh ground 302a when seen through in a Z direction (see FIG. 14A) based on the intermediate data 945 (S4). The analysis unit 922 calculates overlap areas indicated by oblique hatching in FIG. 11, for example.

The analysis unit 922 determines whether variation between respective overlap areas between the signal lines 304a to 304f and conductor parts of the mesh ground 302a is within an acceptable range. For example, the analysis unit 922 determines whether the difference between the maximum value and minimum value of overlap areas between the signal lines 304a to 304f and conductor parts of the mesh ground 302a is less than a specified value (S5).

If the difference between the maximum value and minimum value of the overlap areas exceeds the specified value (No at S5), the analysis unit 922 determines that variation between the overlap areas is not within the acceptable range and moves the placement positions of the openings 320-1 to 320-12 to change the ground-layer layout data 943 (S6).

The analysis unit 922 moves the placement positions of the openings 320-1 to 320-12, for example, from the placement positions shown in FIG. 11 to those shown in FIG. 12 to change the ground-layer layout data 943. The analysis unit 922 creates intermediate data 945' as shown in FIG. 12 based on the signal-layer layout data 942 and the ground-layer layout data 943 after the change (that is, by laying the signal-layer layout data 942 over the ground-layer layout data 943 after the change). The analysis unit 922 again calculates overlap areas (coupling areas) between the signal lines 304a to 304f and conductor parts of the mesh ground 302a, when seen through in a Z direction (see FIG. 14A), based on the intermediate data 945' (S4). The analysis unit 922 calculates overlap areas indicated by oblique hatching in FIG. 12, for example. FIG. 12 illustrates the case where variation between overlap areas (coupling areas) is improved over the case of FIG. 11.

If variation between respective overlap areas between the signal lines 304a to 304f and conductor parts of the mesh ground 302a is within the acceptable range (Yes at S5), the analysis unit 922 decides on the layout of the mesh ground 302a (the placement positions of the openings) (S7). Thus, the ground-layer layout data 943 is decided on.

In the design method shown in FIG. 8, the process of S4 to S7 may be executed by interactive processing instead of batch processing. For example, moving the placement positions of the openings 320-1 to 320-12 (S6) may be performed using the layout editor 941. Or in the design method shown in FIG. 8, the process of S1 to S7 may be executed manually without using the CAD tool.

Figure 13:
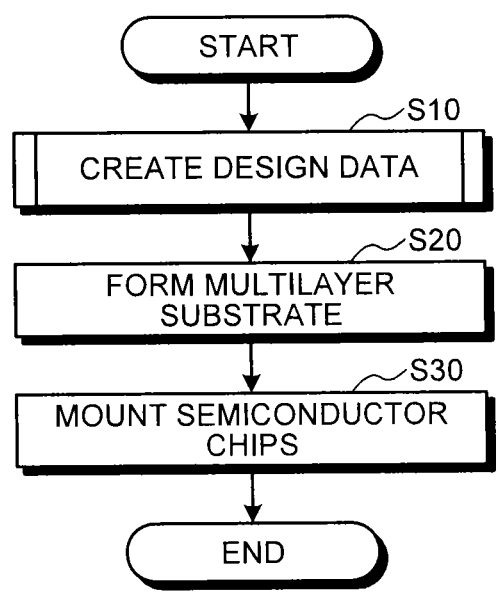
FIG. 13 is a flow chart showing a manufacturing method of a semiconductor device to which the method of designing a multilayer substrate according to the third embodiment is applied.

Next, a manufacturing method of a semiconductor device to which the design method of a multilayer substrate according to the present embodiment is applied will be described using FIG. 13. FIG. 13 is a flow chart showing the manufacturing method of a semiconductor device.

A computer 1 executes the process of S1 to S7 shown in FIG. 8 to create design data for a multilayer substrate (S10). The design data for the multilayer substrate includes, for example, the signal-layer layout data 942 and the ground-layer layout data 943.

A processing apparatus (not shown) processes a base material based on the design data for the multilayer substrate to form the multilayer substrate (S20).

A mounting apparatus (not shown) mounts semiconductor chips (not shown) on the multilayer substrate (S30). Thus, the semiconductor device having semiconductor chips mounted on the multilayer substrate is manufactured.

As described above, in the third embodiment, in the design method of the multilayer substrate, the layout of the multiple openings 320 is decided on such that variation between respective overlap areas between the signal lines 304a to 304f and conductor parts of the mesh ground 302a falls within the acceptable range. Thus, by changing the relative placement of the signal lines 304a to 304d and the mesh ground 2a in the multilayer substrate 1, variation in electrical characteristics between the multiple signal lines 304a to 304d can be suppressed.

Further, in the third embodiment, in the design method of the multilayer substrate, a change in the layout of the multiple openings 320 can be performed by batch processing based on the calculation of overlap areas between the signal lines 304a to 304f and conductor parts of the mesh ground 302a. Thus, the work of designing a multilayer substrate can be made more efficient.

It should be noted that, although the third embodiment illustrates the case where, if variation between respective overlap areas between the signal lines 304a to 304f and conductor parts of the mesh ground 302a is not within the acceptable range, the placement positions of the multiple openings 320 are changed overall, the placement positions of some of the multiple openings 320 may be selectively changed.

Figure 14A:
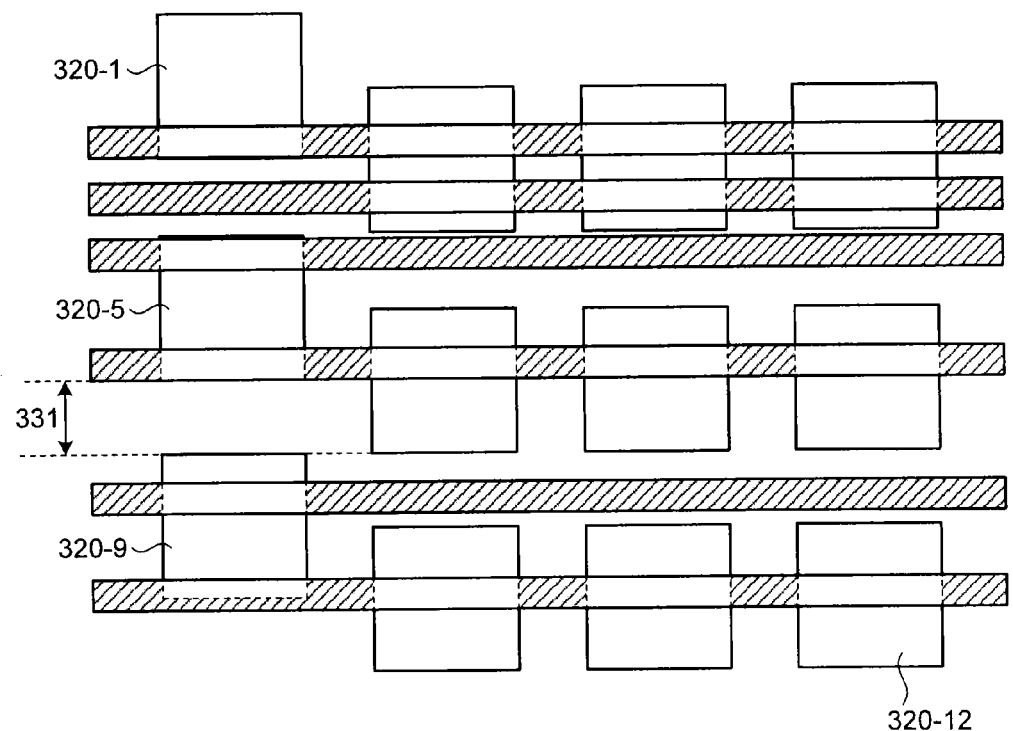
FIG. 14A is a diagram showing overlap areas between the signal lines and the mesh ground after a shift of the mesh ground (a shift of openings on a per column basis from among the multiple openings) in a modified example of the third embodiment.

For example, as shown in FIG. 14A, the placement positions of openings 320-1, 320-5, 320-9 of the leftmost column in FIG. 14A from among the multiple openings 320-1 to 320-12 may be selectively changed by a pitch 331 along a longitudinal direction. For example, for a signal line group having a high proportion of transverse line parts, a longitudinal shift of the mesh ground (a longitudinal shift of some openings 320 on a per column basis) may greatly improve variation between overlap areas (coupling areas). FIG. 14A is a diagram showing overlap areas between the signal lines and the mesh ground after a shift of the mesh ground (a shift of openings on a per column basis from among the multiple openings).

Figure 14B:
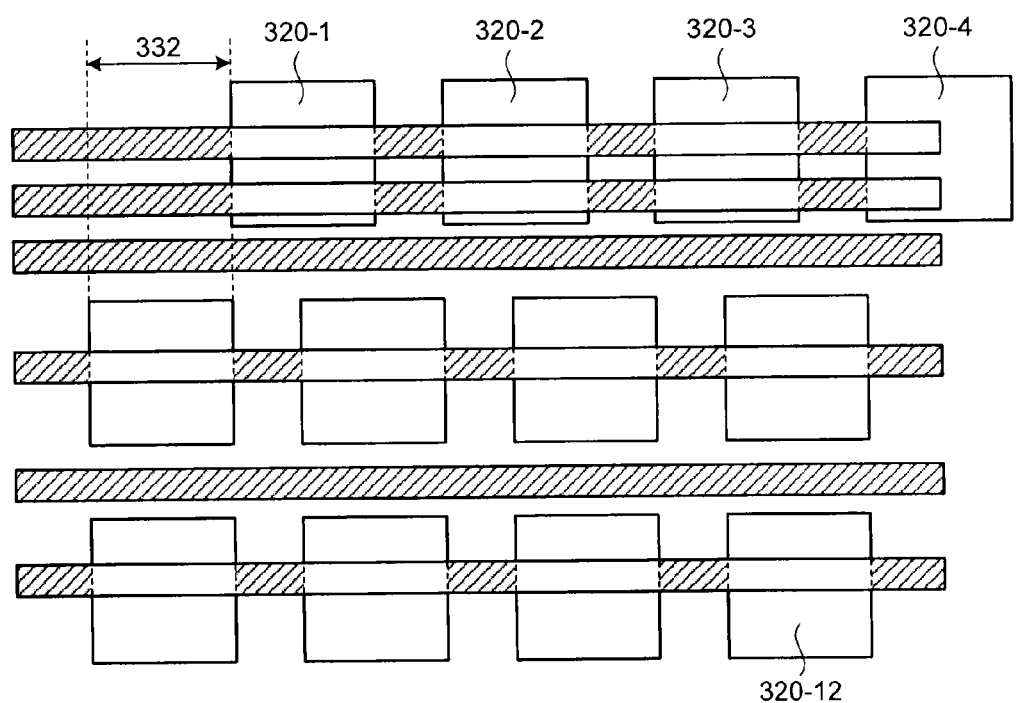
FIG. 14B is a diagram showing overlap areas between the signal lines and the mesh ground after a shift of the mesh ground (a shift of openings on a per row basis from among the multiple openings) in a modified example of the third embodiment.

Or, for example, as shown in FIG. 14B, the placement positions of openings 320-1, 320-2, 320-3, 320-4 of the topmost row in FIG. 14B from among the multiple openings 320-1 to 320-12 may be selectively changed by a pitch 332 along a transverse direction. For example, for a signal line group having a high proportion of longitudinal line parts, a transverse shift of the mesh ground (a transverse shift of some openings 320 on a per row basis) may greatly improve variation between overlap areas (coupling areas). FIG. 14B is a diagram showing overlap areas between the signal lines and the mesh ground after a shift of the mesh ground (a shift of openings on a per row basis from among the multiple openings).

Or if variation between respective overlap areas between the signal lines 304a to 304f and conductor parts of the mesh ground 302a is not within the acceptable range, the placement positions of some of the multiple signal lines 304a to 304f may be changed in addition to changing the placement positions of the multiple openings 320.

Figure 15:
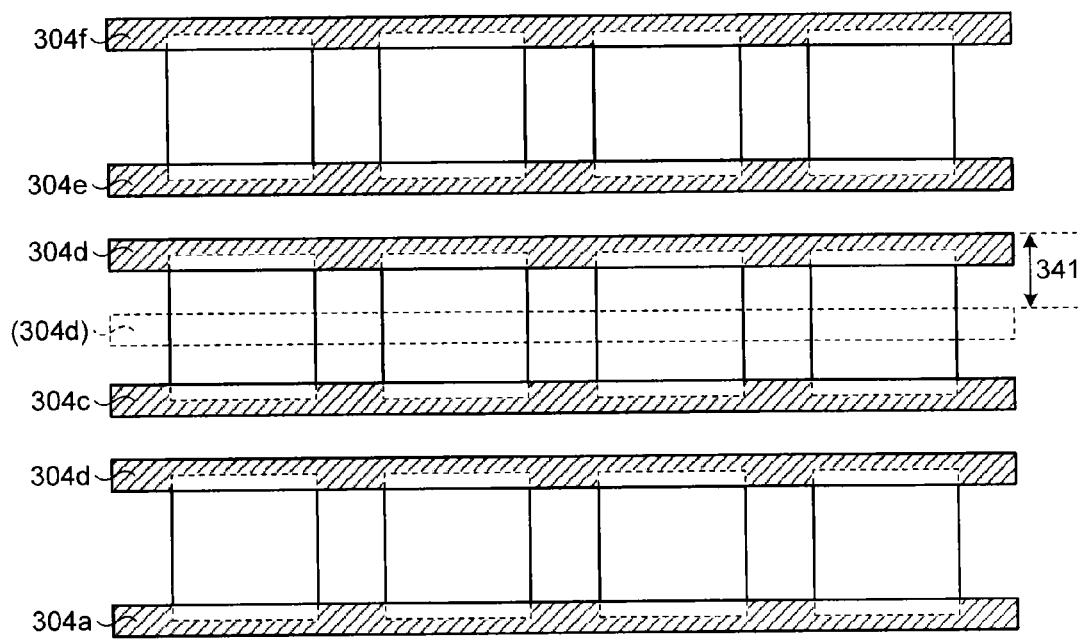
FIG. 15 is a diagram showing overlap areas between the signal lines and the mesh ground after a shift of a signal line in another modified example of the third embodiment.
Figure 16:
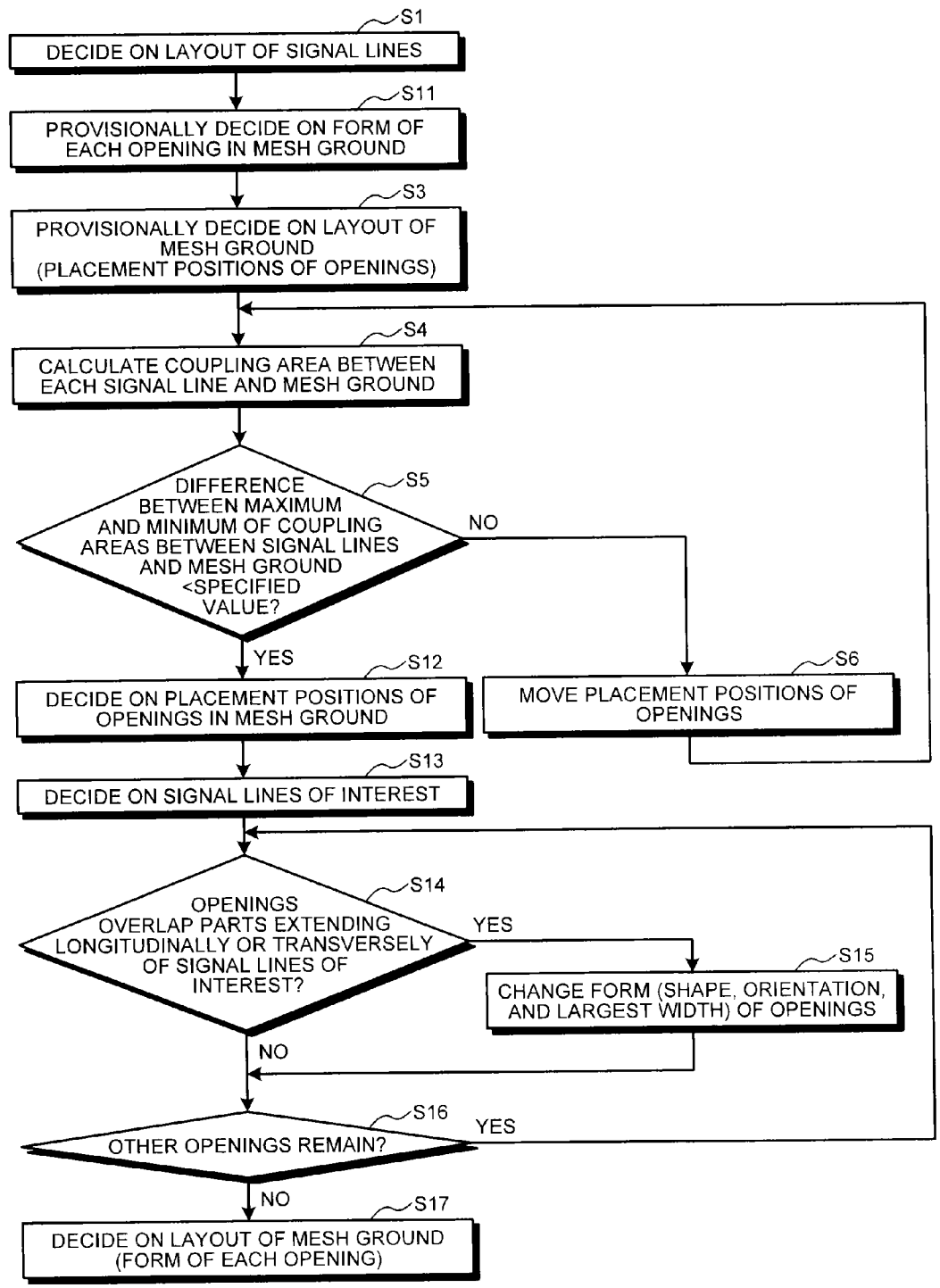
FIG. 16 is a flow chart showing a method of designing a multilayer substrate according to a fourth embodiment.

For example, if the overlap area between the signal line 304d and conductor parts of the mesh ground 302a greatly varies from those of the others from among the multiple signal lines 304a to 304f, the placement position of the signal line 304d may be changed from the position indicated by a broken line in FIG. 15 to the position indicated by a solid line within the scope of design rules (minimum line distances) being satisfied. For example, the position of the signal line 304d may be moved from the position indicated by the broken line by a pitch 341 along a longitudinal direction. FIG. 15 is a diagram showing overlap areas between the signal lines and the mesh ground after a shift of the signal line.

Note that the configuration of the second embodiment may be designed by the design method of the third embodiment. That is, the layout creating unit 921 may determine the shape of outline of each opening in the mesh ground 302a to be substantially circular (S2) and provisionally determine the placement positions of the openings in the mesh ground 302a to be placement positions in a staggered pattern (S3).

Fourth Embodiment

Next, a method of designing a multilayer substrate according to the fourth embodiment will be described. Description will be made below focusing on the differences from the third embodiment.

In the third embodiment, by changing the relative placement of the signal lines 304a to 304f and the mesh ground 302a in the multilayer substrate, variation between respective overlap areas between the signal lines 304a to 304f and conductor parts of the mesh ground 302a is made to fall within the acceptable range.

However, even if variation between respective overlap areas between the signal lines 304a to 304f and conductor parts of the mesh ground 302a falls within the acceptable range, there may be room for further improvement in variation in electrical characteristics between the multiple signal lines 304a to 304f.

Accordingly, in the fourth embodiment, in the state where variation between respective overlap areas between the signal lines 304a to 304f and conductor parts of the mesh ground 302a is within the acceptable range, by selectively making the form of some of the multiple openings different from that of the other openings as in the first embodiment, the further suppression of variation in electrical characteristics between the multiple signal lines 304a to 304f is aimed at.

The layout creating unit 921 decides on the layout of the multiple signal lines 304a to 304f (S1) and then provisionally decides on the form of each opening in the mesh ground 302a (S11).

If variation between respective overlap areas between the signal lines 304a to 304f and conductor parts of the mesh ground 302a is within the acceptable range (Yes at S5), the analysis unit 922 decides on the placement positions of the openings in the mesh ground 302a (S12).

The analysis unit 922 identifies signal lines likely to degrade in electrical characteristics from among the multiple signal lines 304a to 304f and determines the identified signal lines to be signal lines of interest (S13). The analysis unit 922 selects openings to be analyzed from among the multiple openings and determines whether the openings to be analyzed overlap parts extending longitudinally or transversely of the signal lines of interest when seen through in a Z direction (S14).

If the openings to be analyzed overlap parts extending longitudinally or transversely of the signal lines of interest (Yes at S14), then the analysis unit 922 changes the form (at least one of the shape, the orientation, and the largest width) of the openings to a form with which the path length of the return current is shorter (S15).

If the openings to be analyzed do not overlap parts extending longitudinally or transversely of the signal lines of interest (No at S14), then the analysis unit 922 lets the process proceed to S16.

The analysis unit 922 determines whether there are not-yet selected openings among the multiple openings (S16). If there are not-yet selected openings (Yes at S16), the analysis unit 922 selects openings to be analyzed from the not-yet selected openings and lets the process return to S14.

If there are no not-yet selected openings (No at S16), the analysis unit 922 decides on the layout of the mesh ground 302a (the form of each opening) (S17). Thus, the ground-layer layout data 943 is decided on.

As described above, in the fourth embodiment, in the design method of the multilayer substrate, in the state where variation between respective overlap areas between the signal lines 304a to 304f and conductor parts of the mesh ground 302a is within the acceptable range, the form of some of the multiple openings are selectively made different from that of the other openings. Thus, the electrical characteristics of signal lines likely to degrade in electrical characteristics from among the multiple signal lines 304a to 304f can be selectively improved. As a result, variation in electrical characteristics between the multiple signal lines 304a to 304f can be further suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multilayer substrate comprising:
a ground layer including a mesh ground having multiple openings, the multiple openings being arranged in a matrix along a first direction and a third direction, the third direction being substantially perpendicular to the first direction; and
a signal layer laid above the ground layer and including multiple signal lines,
wherein the multiple openings include:
first openings that overlap a first part of a first signal line from among the multiple signal lines when seen through in a direction perpendicular to a surface of the multilayer substrate, the first part extending in the first direction; and
second openings that overlap a second part of the first signal line when seen through in the direction perpendicular to the surface of the multilayer substrate, the second part extending in a second direction, the second direction being different from the first direction, the second direction being different from the third direction, and
wherein the first openings have a first form, and the second openings have a second form different from the first form, and
the second form includes a substantially rectangular shape of outline and a first orientation, the first orientation being an orientation with which a diagonal line of the second opening crosses both the first direction and the third direction.

2. The multilayer substrate according to claim 1, wherein the first form includes a substantially rectangular shape of outline and a second orientation, the second orientation being an orientation with which a diagonal line of the first opening is substantially parallel to the first direction.

3. The multilayer substrate according to claim 2, wherein a maximum diagonal length of the second opening is greater than a maximum diagonal length of the first opening.

4. The multilayer substrate according to claim 1, wherein the multiple openings further include:
third openings that overlap a third part of a second signal line from among the multiple signal lines when seen through in the direction perpendicular to the surface of the multilayer substrate, the third part extending in the first direction; and
fourth openings that overlap a fourth part of the second signal line when seen through in the direction perpendicular to the surface of the multilayer substrate, the fourth part extending in the second direction, and
wherein the third openings have the second form, and the fourth openings have the second form, and
the first orientation is an orientation with which a diagonal line of the third opening crosses both the first direction and the third direction and with which a diagonal line of the fourth opening crosses both the first direction and the third direction.

5. The multilayer substrate according to claim 4, wherein the first form includes a substantially rectangular shape of outline and a second orientation, the second orientation being an orientation with which a diagonal line of the first opening is substantially parallel to the first direction.

6. The multilayer substrate according to claim 5, wherein a maximum diagonal length of the second opening is greater than a maximum diagonal length of the first opening, a maximum diagonal length of the third opening is greater than the maximum diagonal length of the first opening, and a maximum diagonal length of the fourth opening is greater than the maximum diagonal length of the first opening.

7. The multilayer substrate according to claim 4, wherein the first signal line and the second signal line are placed substantially parallel to each other when seen through in the direction perpendicular to the surface of the multilayer substrate.

8. The multilayer substrate according to claim 1, wherein the first form includes a substantially circular shape of outline.

9. The multilayer substrate according to claim 8, wherein a maximum diagonal length of the second opening is greater than a diameter of the first opening.

10. The multilayer substrate according to claim 1, wherein the multiple signal lines together function as a bus line.

* * * * *

UNITED STATES PATENT AND TRADEMARK OFFICE
CERTIFICATE OF CORRECTION

PATENT NO. : 9,864,829 B2  
APPLICATION NO. : 14/847479  
DATED : January 9, 2018  
INVENTOR(S) : Satoru Fukuchi et al.

Page 1 of 1

It is certified that error appears in the above-identified patent and that said Letters Patent is hereby corrected as shown below:

On the Title Page

Item (71), the Applicant's Information is incorrect. Item (71) should read:
-- (71) Applicant: Toshiba Memory Corporation, Minato-ku (JP) --

Signed and Sealed this
Eleventh Day of June, 2019

Andrei Iancu
*Director of the United States Patent and Trademark Office*